United States Patent [19]

Conley

[11] Patent Number: 5,275,882
[45] Date of Patent: Jan. 4, 1994

[54] METHOD FOR IMPROVING ADHESION OF ALUMINUM LAYERS TO THERMOPLASTICS AND ARTICLE

[75] Inventor: Douglas J. Conley, Scotia, N.Y.

[73] Assignee: General Electric Company, Schenectady, N.Y.

[21] Appl. No.: 830,030

[22] Filed: Feb. 3, 1992

[51] Int. Cl.⁵ .............................................. C23C 16/00
[52] U.S. Cl. .................... 428/336; 427/250; 427/255.6; 427/255.7; 427/322; 427/404; 427/534; 427/536; 427/569; 427/585; 428/339; 428/412; 428/457; 428/689
[58] Field of Search ...................... 427/38, 250, 255.7, 427/404, 534, 536, 569, 585, 322, 255.6; 428/336, 412, 457, 339, 689

[56] References Cited

FOREIGN PATENT DOCUMENTS 3533029 3/1987 Fed. Rep. of Germany .
63-121651 5/1988 Japan .

OTHER PUBLICATIONS

Sacher et al., Metallization of Polymers, Chapter 10, pp. 147-160 (Washington, D.C.: American Chemical Society, 1990).

Primary Examiner—Bernard Pianalto
Attorney, Agent, or Firm—William H. Pittman

[57] ABSTRACT

Thermoplastic substrates, particularly those comprising polycarbonate, ABS or polycarbonate-ABS blends, are coated with an adherent aluminum coating having a thickness of at least about 1.5 microns by a process which includes fluorination of the surface followed by physical vapor deposition of aluminum. Fluorination is preferably effected by treatment with a plasma of a fluorine compound, especially a fluorocarbon such as carbon tetrafluoride.

20 Claims, No Drawings

METHOD FOR IMPROVING ADHESION OF ALUMINUM LAYERS TO THERMOPLASTICS AND ARTICLE

This invention relates to the metallization of plastic surfaces, and more particularly to a method for depositing a strongly adherent aluminum coating on thermoplastic articles.

Metallized plastics have become of interest in recent years as a replacement for metal in such articles as enclosures for electrical appliances, microwave ovens, business machines and the like. When fabricated of plastics alone, such enclosures are inadequate to shield internal parts from external radiation sources such as electromagnetic interference, particularly radio frequency interference, and static electricity, and also to prevent escape of internally generated radiation. Such radiation can be blocked by providing a metal coating on the surface of the plastic substrate, typically by electroless or electrolytic deposition.

One of the most serious problems which arise in the metallization of plastics is the lack of adhesion of the metal layer to the substrate. Adhesion is generally measured as "peel strength", which is the force required to peel an adherent metal layer from a substrate under controlled conditions.

Among the thermoplastic materials now in use in the foregoing applications are polyimides; aromatic polycarbonates; various addition polymers, including addition polymers comprising structural groups derived from olefinic nitriles such as acrylonitrile and dienes such as butadiene; and blends of any of the foregoing. A particularly useful class of addition polymers consists of copolymers of acrylonitrile, butadiene and styrene, sometimes identified hereinafter as "ABS resins". They may be prepared by various methods, including the grafting of styrene and acrylonitrile units on a previously prepared polybutadiene latex.

It is often desirable to deposit an aluminum coating on a thermoplastic substrate. This may be achieved by physical vapor deposition, a process in which the metal is heated in vacuum to above its vaporization temperature and is allowed to condense on the substrate, which is maintained at a temperature below the melting point of the aluminum. It is necessary, therefore, to devise treatment methods for improvement of the adhesion to thermoplastic substrates of aluminum coatings thus deposited.

Studies on improvement of the adhesion of metal films to various thermoplastics, including polycarbonate, are reported in Sacher et al., Metallization of Polymers, Chapter 10, pp. 147-160 (Washington, D.C.: American Chemical Society, 1990). The methods studies include treatment of the plastic surface with various plasmas, including ammonia, argon, oxygen and carbon tetrafluoride. The oxygen and carbon tetrafluoride plasmas were found to produce excellent adhesion. However, the aluminum films deposited thereon by physical vapor deposition were only 250 nm. (0.25 micron) thick.

Further study has shown that the deposition of thicker coatings of aluminum - e.g., at least about 1.5 microns - on a thermoplastic substrate presents entirely different problems than the deposition of thin coatings. For example, pretreatment with an oxygen plasma does not improve adhesion of thick coatings sufficiently for commercial use. The same is true of argon plasmas.

The present invention provides a reliable method for improving adhesion of thick aluminum coatings to surfaces of thermoplastic substrates. This is accomplished by a simple chemical treatment operation, which is often preferably achieved by plasma action.

In one of its aspects, therefore, the invention is a method for the deposition of an adherent aluminum coating on a thermoplastic substrate which comprises fluorinating the surface of said substrate and depositing thereon, by physical vapor deposition, an aluminum layer having a thickness of at least about 1.5 microns.

The method of this invention is applicable to any thermoplastic substrate. It is particularly useful on polycarbonates, especially aromatic polycarbonates; addition polymers comprising structural groups derived from olefinic nitriles and dienes; and blends thereof.

The aromatic polycarbonates comprise structural units of the formula

wherein each $R^1$ independently is a divalent aromatic radical. Suitable $R^1$ values include m-phenylene, p-phenylene, 4,4'-biphenylene, 2,2-bis(4-phenylene)propane and similar radicals such as those which correspond to the aromatic dihydroxy compounds disclosed by name or formula (generic or specific) in U.S. Pat. No. 4,217,438, the disclosure of which is incorporated by reference herein. Also included are radicals containing non-hydrocarbon moieties. These may be substituents such as chloro, nitro, alkoxy and the like, and also linking radicals such as thio, sulfoxy, sulfone, ester, amide, ether and carbonyl. Most often, however, all $R^1$ radicals are hydrocarbon radicals.

The $R^1$ radicals preferably have the formula

wherein each of $A^1$ and $A^2$ is a monocyclic divalent aromatic radical and Y is a bridging radical in which one or two atoms separate $A^1$ and $A^2$. The free valence bonds in formula II are usually in the meta or para positions of $A^1$ and $A^2$ in relation to Y.

In formula II, the $A^1$ and $A^2$ values may be unsubstituted phenylene or substituted derivatives thereof, illustrative substituents (one or more) being alkyl, alkenyl, halo (especially chloro and/or bromo), nitro, alkoxy and the like. Unsubstituted phenylene radicals are preferred. Both $A^1$ and $A^2$ are preferably p-phenylene, although both may be o- or m-phenylene or one o- or m-phenylene and the other p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, 2-[2.2.1]-bicycloheptylmethylene, ethylene, isopropylidene, neopentylidene, cyclohexylidene, cyclopentadecylidene, cyclododecylidene or adamantylidene, especially a gemalkylene (alkylidene) radical. Also included, however, are unsaturated radicals and radicals which contain atoms other than carbon and hydrogen; for example, 2,2-dichloroethylidene, carbonyl, phthalidylidene, oxy, thio, sulfoxy and sulfone. For reasons of availability and particular suitability for the purposes of this invention, the preferred radical of formula II is the 2,2-bis(4-phenylene)propane radical, which is derived from bisphenol A and in which Y is isopropylidene and $A^1$ and $A^2$ are each p-phenylene.

Typical olefinic nitriles whose structural units are present in the nitrile-diene addition polymers are acrylonitrile and methacrylonitrile, the former generally being preferred because of its availability and particular suitability. Suitable dienes include butadiene, isoprene, chloroprene and 1,3-hexadiene, with butadiene being preferred.

Such addition copolymers usually also contain structural units derived from an alkenylaromatic compound such as styrene, α-methylstyrene or 4-methylstyrene. Styrene is generally preferred. Thus, the suitable addition polymers include the ABS resins, which are generally the preferred addition polymers.

The preferred ABS resins are those prepared by the grafting of styrene and acrylonitrile on a previously formed polybutadiene latex. A possible intermediate in such a method of preparation is a styrene-acrylonitrile copolymer, sometimes hereinafter designated "SAN copolymer". It is also within the scope of the invention, however, to employ as the ABS resin a blend of a SAN copolymer with a previously formed ABS polymer with a relatively high proportion of butadiene units, typically about 40-75% and preferably at least about 50% by weight, hereinafter designated "high rubber graft". In any event, the proportions of combined styrene and acrylonitrile in the ABS resin are most often about 60-90% and preferably about 70-80%.

Proportions of acrylonitrile and styrene taken individually are subject to wide variation, depending on the properties desired in the resinous article. Most often, the styrene comprises about 60-90% by weight of the mixture of the two monomers. Unless special conditions are employed, a styrene-acrylonitrile copolymer generally comprises about 75% styrene and about 25% acrylonitrile structural units irrespective of the monomer proportions in the copolymerization mixture, and those are therefore the proportions most often employed.

Blends of polycarbonate and the aforementioned addition polymers constitute another preferred class of thermoplastics for use in the invention. Polycarbonate usually comprises a major proportion of such blends, usually about 65-95% by weight and most often about 70-90% thereof. Under these conditions, the polycarbonate is usually the continuous phase in the resin blend with the ABS resin being dispersed therein. No copolymerization between the polycarbonate and the ABS resin is usually observed, but copolymerization is not precluded for the purposes of the invention.

The resinous substrate may contain other materials in addition to the above-described resins. These include flame retardants, initiators, inhibitors, stabilizers, plasticizers, pigments, antistatic agents, impact modifiers, fillers and mold release agents.

Prior to the method of this invention, it is generally preferred to clean the substrate surface to remove grease, dirt and the like. Use of a conventional soap or detergent solution for this purpose is acceptable.

According to the invention, the adhesion of the aluminum to the resinous substrate is promoted by fluorinating the substrate surface. By "fluorinating" is meant any means of attaching fluorine atoms to a molecule, including attachment of fluorine-containing radicals such as $CF_3$ which may take place upon treatment with a fluorocarbon plasma as discussed hereinafter.

Fluorination may be by art-recognized chemical means, such as contact with liquid fluorine. It is generally preferred, however, to expose the substrate to a plasma of a fluorine-containing compound. Compounds which may be employed include fluorinated hydrocarbons and sulfur-fluorine compounds, as illustrated by carbon tetrafluoride, hexafluoroethane and sulfur hexafluoride. Carbon tetrafluoride is often preferred by reason of its relatively low cost and particular effectiveness.

The present invention does not include plasma treatment with a mixture of a fluorine compound and oxygen. Such treatment is used for various other purposes, including the etching of semiconductors. It has not, however, been found effective to improve the adhesion of aluminum layers to thermoplastics.

The invention does, however, include dilution of the fluorine compound with an inert compound, particularly an inert gas. Such gases include nitrogen, argon and helium.

Treatment with the fluorinating plasma may be effected by conventional means, typically involving the use of an inductively or capacitively coupled plasma generation apparatus under vacuum conditions, most often 1 torr or less. A system using parallel plate electrodes is illustrative. Power for plasma formation may be provided in the form of radiofrequency radiation or equivalent means.

Any substantial degree of fluorination of the substrate surface will improve adhesion of the aluminum layer. It is usually preferred, however, for the average atomic proportion of fluorine in the first 50 Ångstroms below the substrate surface to be at least about 30%. This may typically be achieved by plasma treatment for at least about 10 seconds, preferably about 10-300 seconds.

In the second step of the method of the invention, an aluminum layer is deposited by physical vapor deposition on the fluorinated substrate surface. This may be done by conventional aluminum deposition means, typically by placing the substrate and a source of elemental aluminum in a vacuum chamber and heating the aluminum source to a temperature in the range of about 700°-1000° C. It is essential, of course, to maintain the substrate surface below its deformation temperature during aluminum deposition.

The thickness of the aluminum layer deposited according to the present invention is at least about 1.5 microns. Thicknesses of about 2-5 microns are sufficient for most applications and therefore preferred.

It has been found that plasma fluorination is uniformly successful in substantially improving adhesion of aluminum layers of this thickness. On the other hand, other plasma treatments involving, for example, nitrogen, argon or helium alone or hydrogen, oxygen or nitrous oxide are ineffective for this purpose. This would not be expected on the basis of the Sacher et al. publication mentioned hereinabove, which showed oxygen and carbon tetrafluoride plasmas to be of about equal effectiveness and argon and ammonia plasmas slightly less effective for improvement of adhesion of films having a thickness on the order of 0.25 micron.

Aluminum-coated resinous substrates prepared by the above-described method are another aspect of the invention. They have substantially improved adhesion of the aluminum to the resin surface, in comparison with untreated substrates.

This is shown by the results of a cross-hatch tape test adapted from ASTM procedure D3359. In the adaption, a tool is used to score the metal surface with a series of perpendicular lines to form a grid. A piece of pressuresensitive tape is adhered to the metal surface over the grid and is sharply removed by pulling at approximately 90°. The grid area is then visually inspected for removal of the metal layer and the percentage of metal removed is determined visually. If more than 5% has been removed, the specimen is considered to have failed the test since many purchasers will not consider a part satisfactory under those conditions.

The invention is illustrated by the following examples. All percentages are by weight unless otherwise indicated. The polycarbonate employed was a commercially available bisphenol A polycarbonate.

EXAMPLE 1

A polycarbonate test plaque was exposed for 15 seconds to a carbon tetrafluoride plasma created at a pressure of about 100 millitorr in a parallel plate Plasmatherm 2411 single radio frequency plasma chamber operated at 13.56 megahertz. The proportion of fluorine in the 50-Ångstrom surface layer was found by X-ray photoelectron spectroscopy to be 32.3 atomic percent.

An aluminum coating was then applied by physical vapor deposition in a Varian 3118 vacuum coater, by evaporation of aluminum from a boron nitride crucible and at a deposition rate of 15-25 Ångstroms per second as controlled by an Inficon IC6000 process controller. The final thickness of the aluminum layer was 2-3 microns.

The aluminum-coated specimen was subjected to the cross-hatch tape test and passed the test with 100% adhesion.

Control samples were treated with hydrogen, argon, helium, oxygen and nitrous oxide plasmas prior to aluminum deposition. All of them failed the cross-hatch tape test.

EXAMPLE 2

The procedure of Example 1 was repeated, substituting for the polycarbonate a polymer blend consisting of 88.4% polycarbonate, 5.5% SAN copolymer, 6.1% high rubber graft and various conventional additives including 8.9%, based on total resin content, of tetraphenyl resorcinol diphosphate as a flame retardant, said blend containing 8.6% total SAN copolymer and 3.0% butadiene units. It also passed the cross-hatch tape test with 100% adhesion.

EXAMPLE 3

The procedure of Example 1 was repeated, substituting for the polycarbonate a polymer blend consisting of 80.4% polycarbonate, 10.4% SAN copolymer, 9.2% high rubber graft and various conventional additives including 13.3%, based on total resin content, of a commercially available flame retardant additive. It contained 15.0% total SAN copolymer and 4.6% butadiene units. The proportion of fluorine in the surface layer was found to be 41.29 atomic percent. The sample passed the cross-hatch tape test with 100% adhesion.

EXAMPLES 4-5

Polymer plaques identical to those of Examples 1 and 3 were exposed to a hexafluoroethane plasma under similar conditions, and then coated with aluminum. The proportions of fluorine in the surface layers were found to be 36.3 atomic percent (polycarbonate) and 43.6 atomic percent (polycarbonate-SAN blend). Both samples passed the cross-hatch tape test with 100% adhesion.

EXAMPLE 6

The procedure of Example 1 was repeated, except that a sulfur hexafluoride plasma was employed. The surface layer was found to contain 42.05 atomic percent fluorine. The sample passed the cross-hatch tape test with 100% adhesion.

Results comparable to those of the foregoing examples were obtained when the thermoplastic was an ABS resin, rather than a polycarbonate or polycarbonate-ABS blend.

What is claimed is:

1. A method for the deposition of an adherent aluminum coating on a thermoplastic substrate which comprises fluorinating the surface of said substrate and depositing thereon, by physical vapor deposition, an aluminum layer having a thickness of at least about 1.5 microns.

2. A method according to claim 1 wherein fluorination is effected by exposing the substrate to a plasma of fluorine-containing compound.

3. A method according to claim 2 wherein the substrate is polycarbonate, a copolymer of acrylonitrile, butadiene and styrene or a mixture thereof.

4. A method according to claim 3 wherein the fluorine-containing compound is a fluorinated hydrocarbon or a sulfur-fluorine compound.

5. A method according to claim 4 wherein plasma treatment is for a period of about 10-30 seconds.

6. A method according to claim 5 wherein the substrate surface is cleaned prior to plasma treatment.

7. A method according to claim 5 wherein the substrate is polycarbonate.

8. An aluminum-coated resinous substrate prepared by the method of claim 7.

9. A method according to claim 5 wherein the polycarbonate is a bisphenol A polycarbonate.

10. An aluminum-coated resinous substrate prepared by the method of claim 9.

11. A method according to claim 5 wherein the thickness of the aluminum layer is about 2-3 microns.

12. A method according to claim 11 wherein the fluorine compound is carbon tetrafluoride or hexafluoroethane.

13. A method according to claim 5 wherein the substrate is a blend of polycarbonate with a copolymer of acrylonitrile, butadiene and styrene.

14. A method according to claim 13 wherein the polycarbonate is a bisphenol A polycarbonate.

15. An aluminum-coated resinous substrate prepared by the method of claim 14.

16. A method according to claim 13 wherein the thickness of the aluminum layer is about 2-3 microns.

17. A method according to claim 16 wherein the fluorine compound is carbon tetrafluoride or hexafluoroethane.

18. An aluminum-coated resinous substrate prepared by the method of claim 13.

19. An aluminum-coated resinous substrate prepared by the method of claim 2.

20. An aluminum-coated resinous substrate prepared by the method of claim 1.

* * * * *